US012629952B2

(12) United States Patent
Choi

(10) Patent No.: US 12,629,952 B2
(45) Date of Patent: *May 19, 2026

(54) TRANSFER SUBSTRATE USED IN MANUFACTURE OF DISPLAY APPARATUS, DISPLAY APPARATUS, AND MANUFACTURING METHOD FOR DISPLAY APPARATUS

(71) Applicant: LG ELECTRONICS INC., Seoul (KR)

(72) Inventor: Hwanjoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 524 days.

This patent is subject to a terminal disclaimer.

(21) Appl. No.: 18/022,300

(22) PCT Filed: Aug. 20, 2020

(86) PCT No.: PCT/KR2020/011113
§ 371 (c)(1),
(2) Date: Feb. 21, 2023

(87) PCT Pub. No.: WO2022/039300
PCT Pub. Date: Feb. 24, 2022

(65) Prior Publication Data
US 2024/0038940 A1 Feb. 1, 2024

(51) Int. Cl.
*B41M 5/46* (2006.01)
*G02B 5/00* (2006.01)
(Continued)

(52) U.S. Cl.
CPC ............... *B41M 5/46* (2013.01); *G02B 5/003* (2013.01); *H10H 20/855* (2025.01);
(Continued)

(58) Field of Classification Search
CPC ...... B41M 5/46; G02B 5/003; H01L 25/0753; H10H 20/0361; H10H 20/8511; H10H 20/8512; H10H 20/855
See application file for complete search history.

(56) References Cited

U.S. PATENT DOCUMENTS 11,961,947 B2 * 4/2024 Choi .................... H01L 25/0753
2008/0157103 A1 7/2008 Chandra
2022/0367771 A1 * 11/2022 Choi .................... H01L 25/0753

FOREIGN PATENT DOCUMENTS

JP 2006244729 A * 9/2006
KR 10-2012-0001693 A 1/2012
(Continued)

*Primary Examiner* — Gerard Higgins
(74) *Attorney, Agent, or Firm* — Birch, Stewart, Kolasch & Birch, LLP

(57) ABSTRACT
The present invention is applicable to a technical field related to display apparatuses, and the present invention relates to a transfer substrate that transfers a phosphor onto a semiconductor light-emitting device, in which the transfer substrate may comprise: a temporary substrate; a unit phosphor structure which is provided on the temporary substrate and comprises a color filter, a phosphor stacked on the color filter, and a phosphor binder for fixing the phosphor; and a light-absorption layer, which is an inorganic layer provided between the temporary substrate and the color filter, and absorbs light to separate the unit phosphor structure from the temporary substrate.

8 Claims, 18 Drawing Sheets

(51) Int. Cl.
    *H10H 20/855*    (2025.01)
    *H10H 20/01*    (2025.01)
    *H10H 20/851*    (2025.01)
    *H10W 90/00*    (2026.01)

(52) U.S. Cl.
    CPC ..... *H10H 20/0361* (2025.01); *H10H 20/8511*
                  (2025.01); *H10W 90/00* (2026.01)

(56)               References Cited

FOREIGN PATENT DOCUMENTS

| KR | 10-2013-0079496 A | 7/2013 | |
|----|----|----|----|
| KR | 10-1738304 B1 | 5/2017 | |
| KR | 10-1769356 B1 | 8/2017 | |
| KR | 20190092331 A * | 8/2019 | .......... H01L 27/156 |

\* cited by examiner

TRANSFER SUBSTRATE USED IN MANUFACTURE OF DISPLAY APPARATUS, DISPLAY APPARATUS, AND MANUFACTURING METHOD FOR DISPLAY APPARATUS

CROSS REFERENCE TO RELATED APPLICATIONS

This application is the National Phase of PCT/KR2020/011113 filed on Aug. 20, 2020, which is hereby expressly incorporated by reference into the present application.

TECHNICAL FIELD

The present disclosure is applicable to a display device-related technical field, and relates to, for example, a method for manufacturing a display device using light emitting diodes (LEDs) and a transfer substrate used for manufacturing the display device.

BACKGROUND

Recently, a liquid crystal display (LCD), an organic light emitting diode (OLED) display, a micro LED display, and the like are competing to realize a large area, thin, and flexible display in a display technology field.

However, the LCD has problems such as not fast response time and low efficiency of light generated by a backlight, and the OLED has weaknesses such as short life span, poor mass production yield, and low efficiency.

On the other hand, when a semiconductor light emitting element (a micro LED) having a diameter or a surface area equal to or smaller than 100 microns is used for a display, very high efficiency may be achieved because the display does not absorb light using a polarizer or the like.

However, a large-sized display requires millions of semiconductor light emitting elements, while manufacturing and arranging R, G, and B light emitting elements has a problem in that a manufacturing process is complicated and a manufacturing cost is high. Therefore, a display device was implemented using only the LEDs emitting blue light, and RGB light was implemented by disposing a phosphor on the blue LED.

However, in a process of transferring the phosphor onto the semiconductor light emitting device, a problem that a surface of the transferred phosphor is deformed or the phosphor is not transferred and re-adhered to a transfer substrate again has occurred.

Accordingly, in the present disclosure, a display device manufactured by transferring a phosphor and a transfer method thereof are presented to implement the display using the LED, in particular, the display using the micro LED.

SUMMARY

Technical Problem

An object of one embodiment of the present disclosure is to reduce a degree of deformation of a surface of a phosphor structure transferred in a transfer process for manufacturing a display device.

Another object of one embodiment of the present disclosure is to solve a problem that a phosphor is not transferred and re-adhered to a transfer substrate in the transfer process for manufacturing the display device.

Another object of one embodiment of the present disclosure is to reduce damage to a wiring substrate during a laser lift-off (LLO) process.

Furthermore, another object of one embodiment of the present disclosure is to solve various problems not mentioned here. A person skilled in the art may understand the entire meaning of the present document and drawings.

Technical Solutions

A transfer substrate for transferring a phosphor onto a semiconductor light emitting element for achieving the objects includes a temporary substrate, a unit phosphor structure disposed on the temporary substrate and including a color filter, a phosphor stacked on the color filter, and a phosphor binder for fixing the phosphor, and a light absorbing layer including an inorganic layer disposed between the temporary substrate and the color filter, for absorbing light to separate the unit phosphor structure from the temporary substrate.

In addition, the light absorbing layer may have an amorphous crystal structure variable by absorbing light.

In addition, the transfer substrate may further include a protective layer for preventing the color filter from being damaged by light applied to the light absorbing layer and adhering the light absorbing layer and the color filter.

In addition, the protective layer may be disposed on the light absorbing layer to be segmented to correspond to an area where the phosphor structure is disposed.

In addition, the transfer substrate may further include a metal film between neighboring phosphor structures to correspond to an area where the protective layer is segmented.

In addition, the metal film may be applied to respective side surfaces of the neighboring phosphor structures facing each other.

In addition, one phosphor structure may be connected to a neighboring phosphor structure via the color filter.

In addition, a micro lens pattern may be included at an interface between the color filter and the phosphor structure.

A transfer substrate for transferring a phosphor onto a semiconductor light emitting element for achieving the objects includes a temporary substrate includes a temporary substrate, a plurality of unit phosphor structures disposed on the temporary substrate and including the phosphor, a phosphor binder for fixing the phosphor, and a color filter stacked on the phosphor binder, and a light absorbing layer including an inorganic layer disposed between the temporary substrate and the phosphor binder, for absorbing light to separate the unit phosphor structure from the temporary substrate.

A method for manufacturing a transfer substrate for transferring a phosphor onto a semiconductor light emitting element for achieving the objects includes stacking a light absorbing layer including an inorganic layer, on a temporary substrate, patterning a color filter on the light absorbing layer, placing a partition wall between neighboring patterned color filters, filling a phosphor binder containing the phosphor in a space between the partition wall and the color filters, and removing the partition wall.

In addition, the color filter and the phosphor binder may constitute a unit phosphor structure, and the light absorbing layer may have an amorphous crystal structure variable by absorbing light and absorbs light to separate the unit phosphor structure from the temporary substrate.

In addition, the method may further include stacking a protective layer between the light absorbing layer and the color filter.

In addition, the stacking of the protective layer may include stacking the protective layer so as to be segmented to correspond to the pattern of the color filters.

In addition, the method may further include applying a metal film between neighboring phosphor structures to correspond to an area where the protective layer is segmented.

A method for manufacturing a transfer substrate for transferring a phosphor onto a semiconductor light emitting element for achieving the objects includes stacking a light absorbing layer including an inorganic layer, on a temporary substrate, placing partition walls on the light absorbing layer, filling a phosphor binder containing the phosphor in a space between the partition walls, stacking a color filter on the phosphor binder, and removing the partition walls.

Advantageous Effects

The transfer substrate including the phosphor structure according to one embodiment may include the light absorbing layer formed as the inorganic layer between the phosphor structure and the temporary substrate, so that the situation in which the transfer is not performed or the phosphor structure is re-adhered to the temporary substrate again after being transferred may be prevented.

The transfer substrate including the phosphor structure according to one embodiment may further include the protective layer between the light absorbing layer and the phosphor structure to prevent the damage to the color filter and the wiring substrate.

The transfer substrate including the phosphor structure according to one embodiment may further include a metal film between the adjacent two phosphor structures to prevent the damage to the color filter and the wiring substrate.

Furthermore, there are additional technical effects of the present disclosure not mentioned herein, and those skilled in the art may understand such effects through the entirety of the present document and drawings.

BRIEF DESCRIPTION OF THE DRAWINGS

FIGS. 3A and 3B are cross-sectional diagrams taken along the cutting lines B-B and C-C in FIG. 2;

FIGS. 5A to 5C are conceptual diagrams illustrating various examples of color implementation with respect to a flip-chip type semiconductor light emitting element;

FIG. 8 is a cross-sectional diagram taken along a cutting line D-D shown in FIG. 8;

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
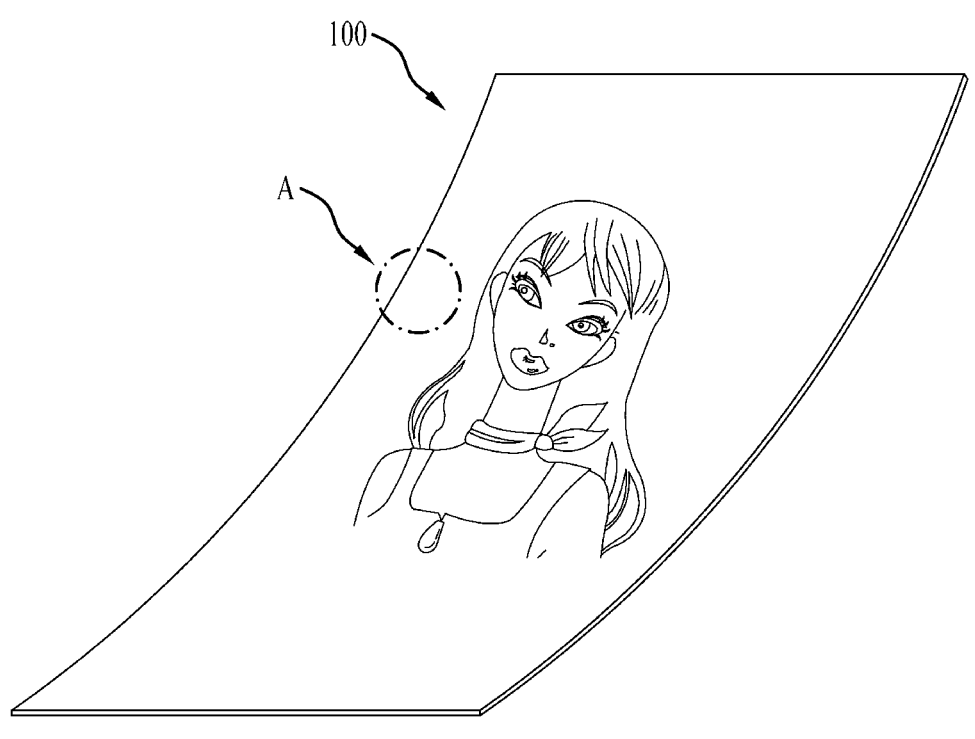
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
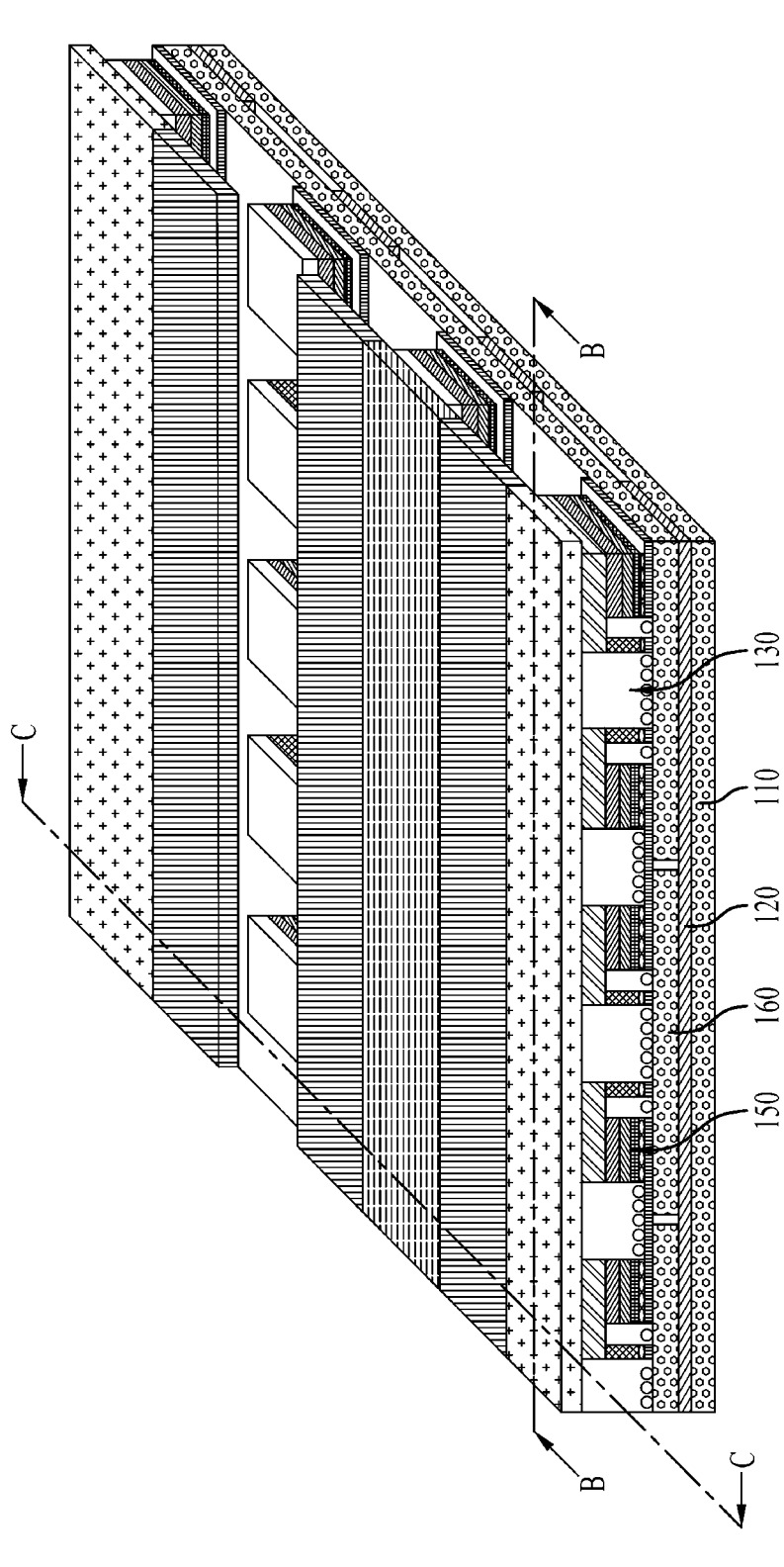
FIG. 2 is a partially enlarged diagram showing a part A shown in FIG. 1.

FIG. 2 is a partially enlarged view showing part A of FIG. 1.

Figures 3A, 3B:
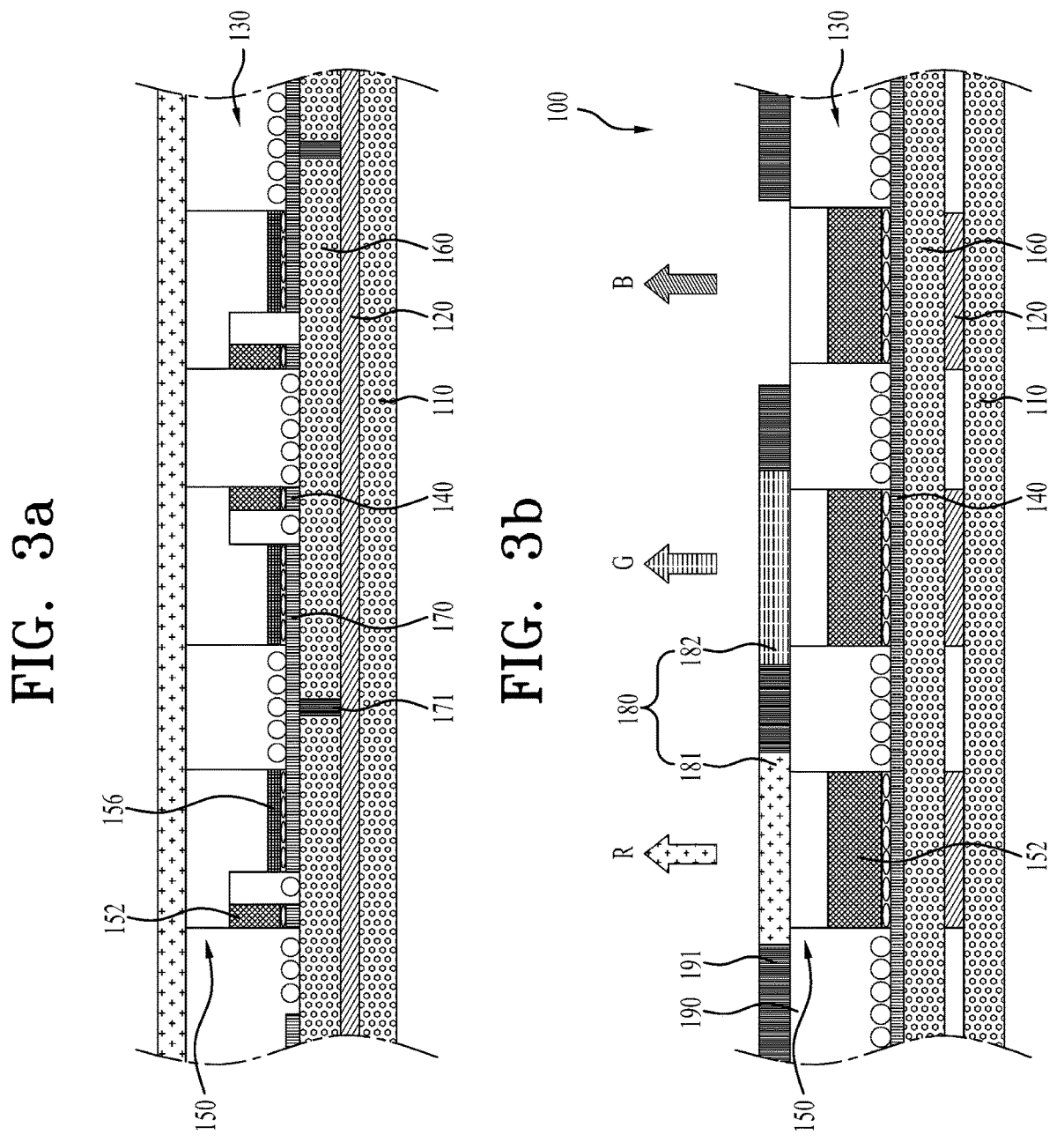

FIGS. 3A and 3B are cross-sectional views taken along lines B-B and C-C in FIG. 2.

Figure 4:
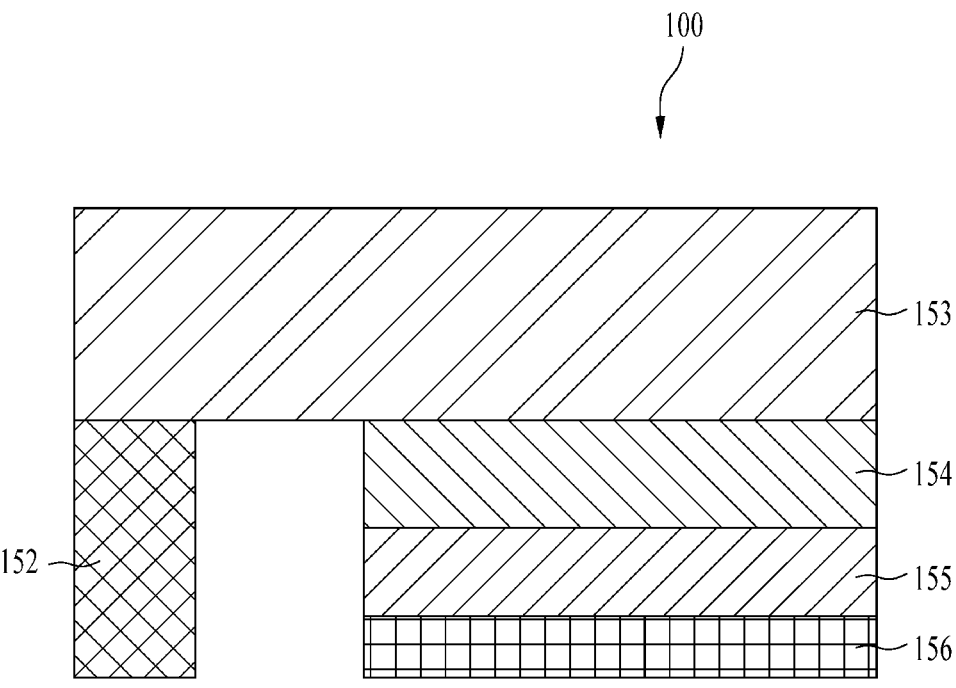
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figures 5A, 5B:
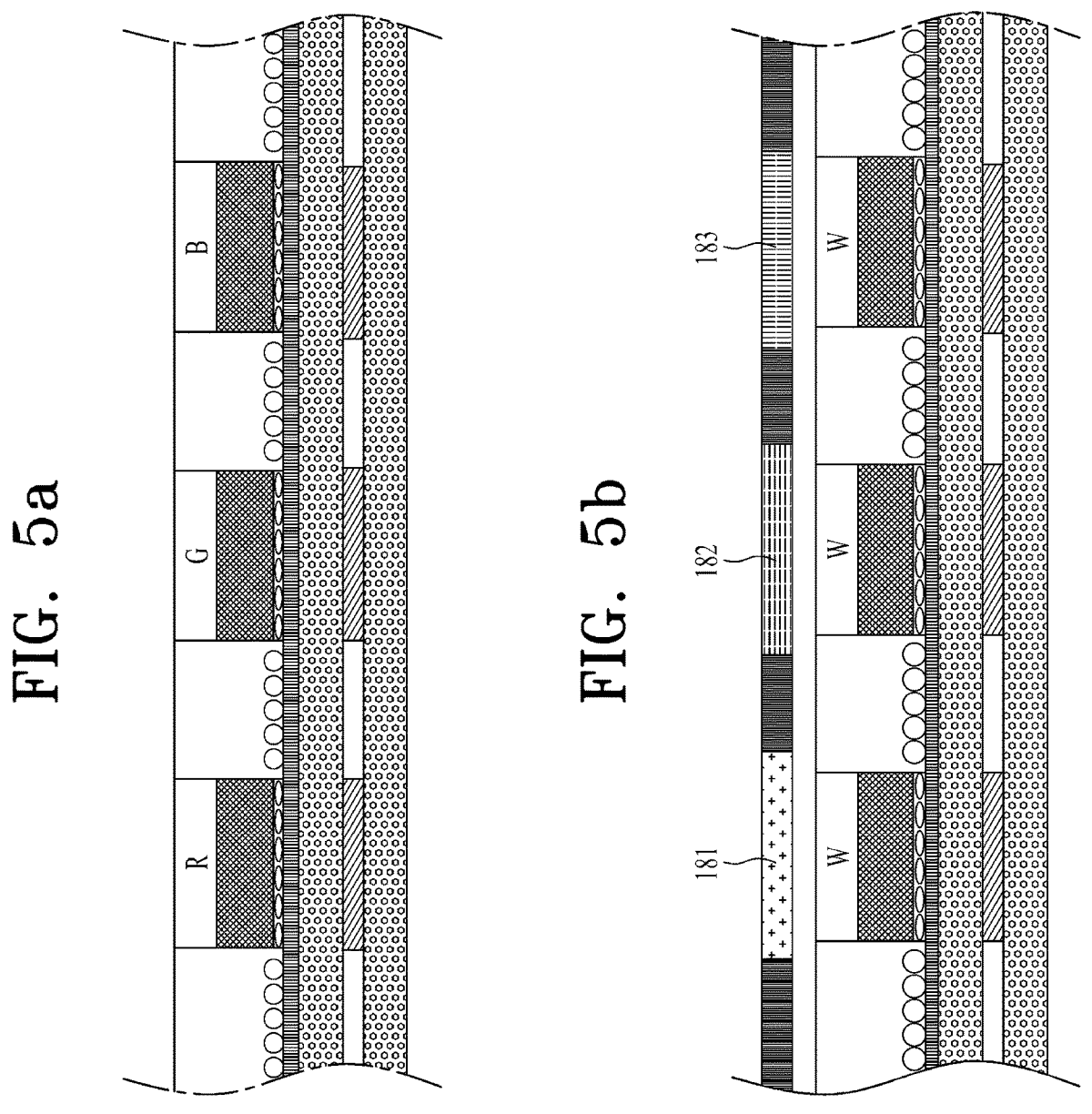
Figure 5C:
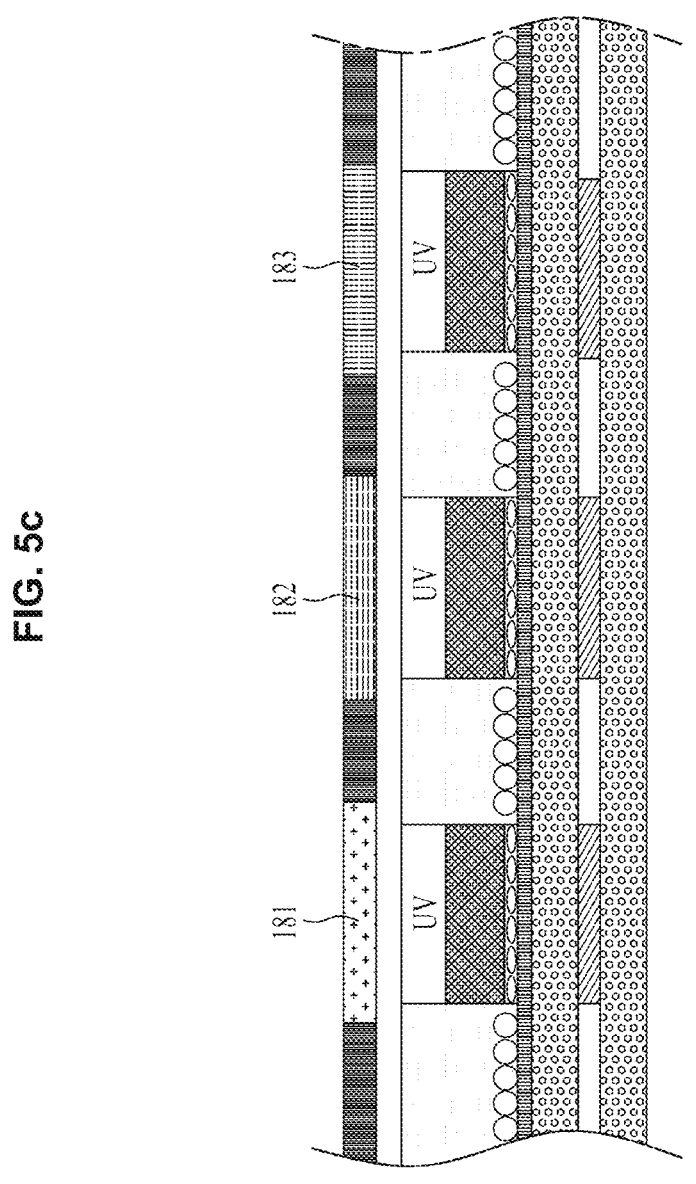

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting element array, and a phosphor conversion layer 180 may be formed on the light emitting element array.

The light emitting element array may include a plurality of semiconductor light emitting elements having different luminance values. The semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, the semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
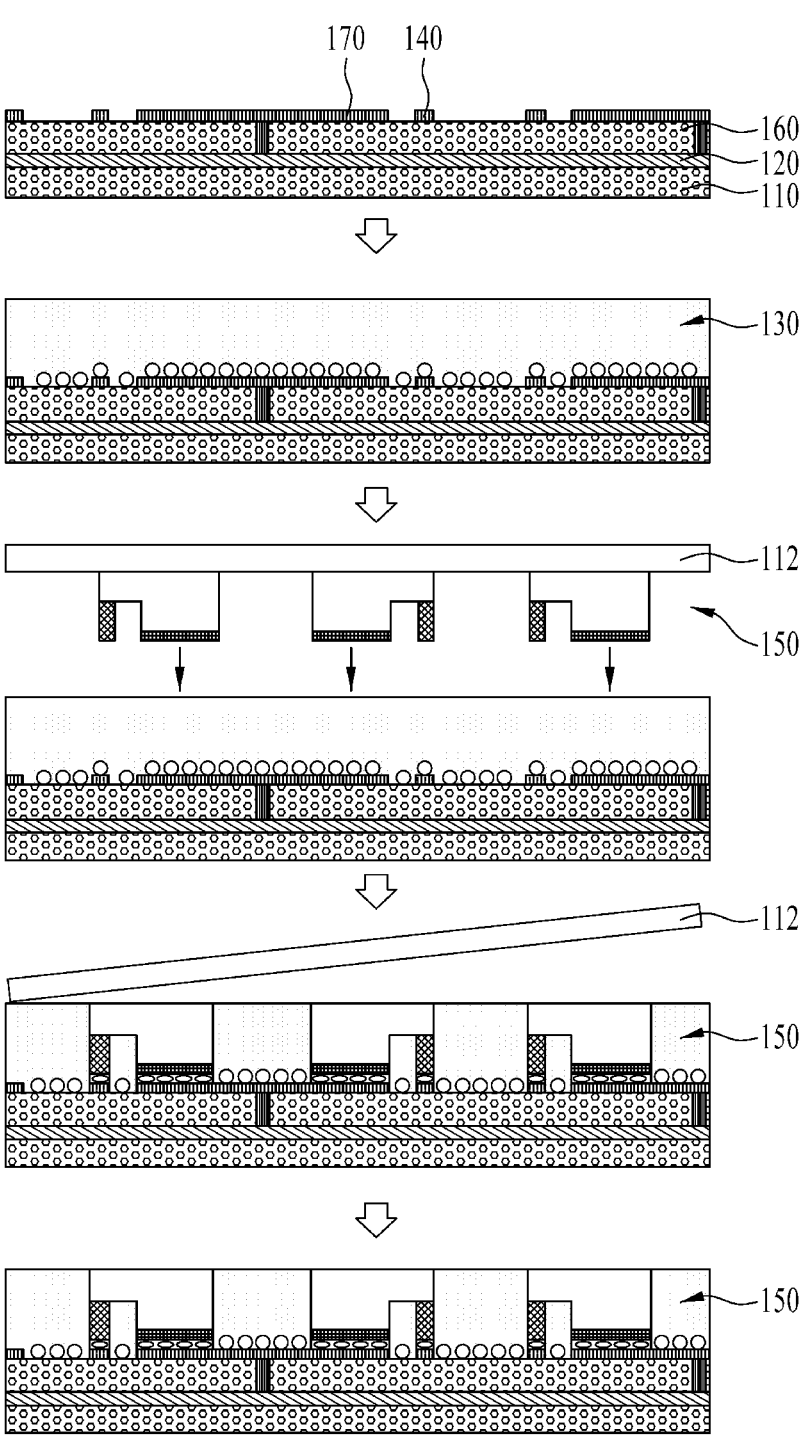
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
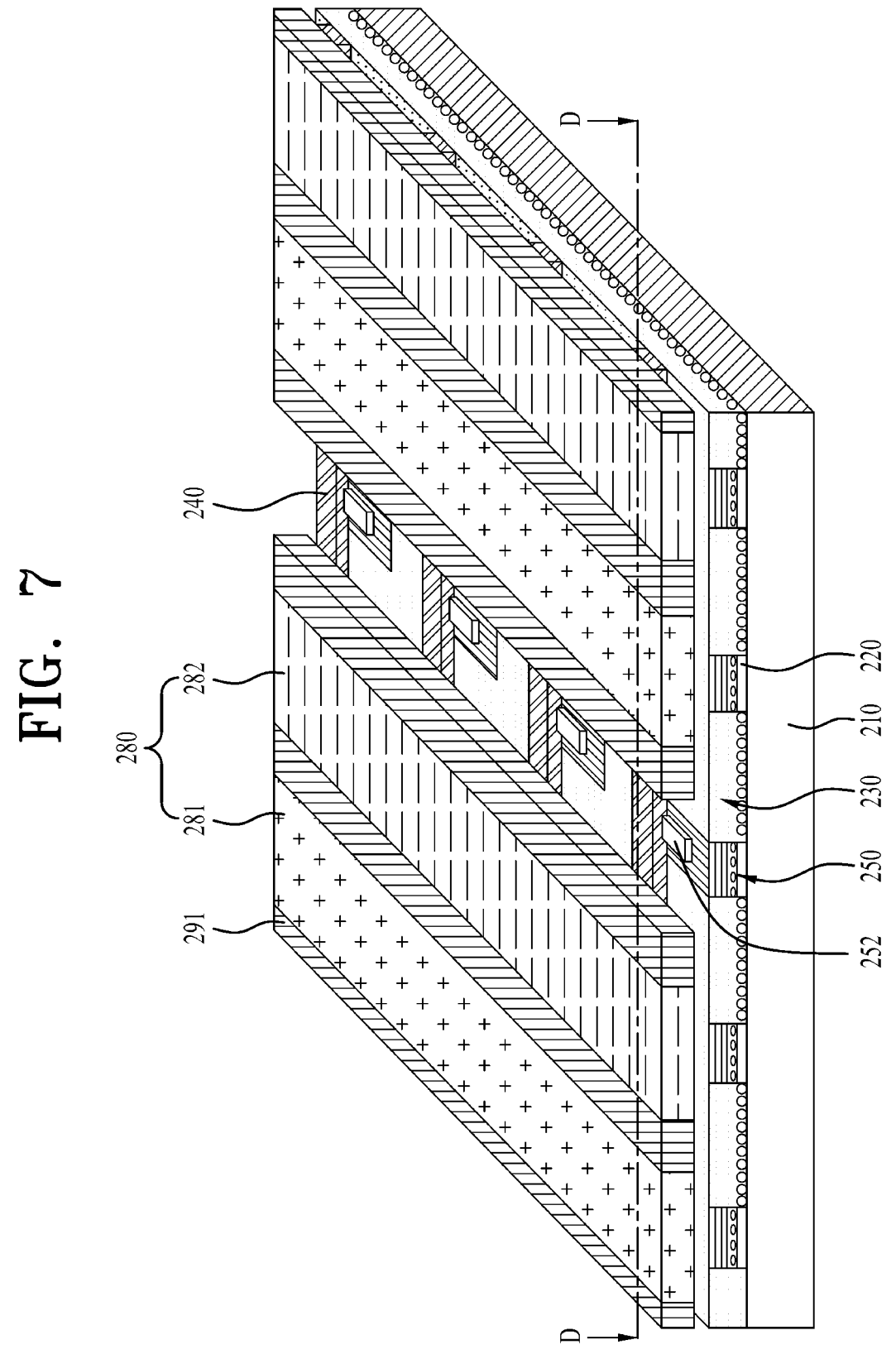
FIG. 7 is a perspective diagram of a display device using a semiconductor light emitting element according to another embodiment of the present disclosure.
Figure 8:
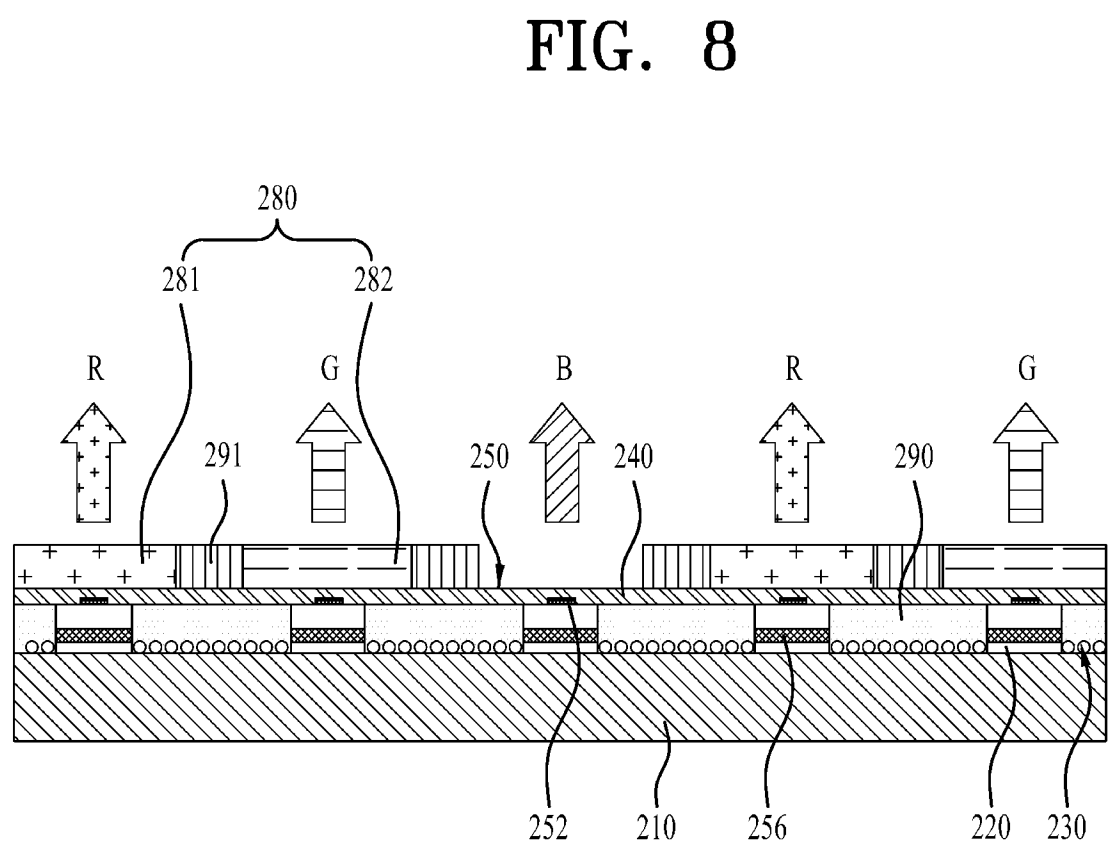
Figure 9:
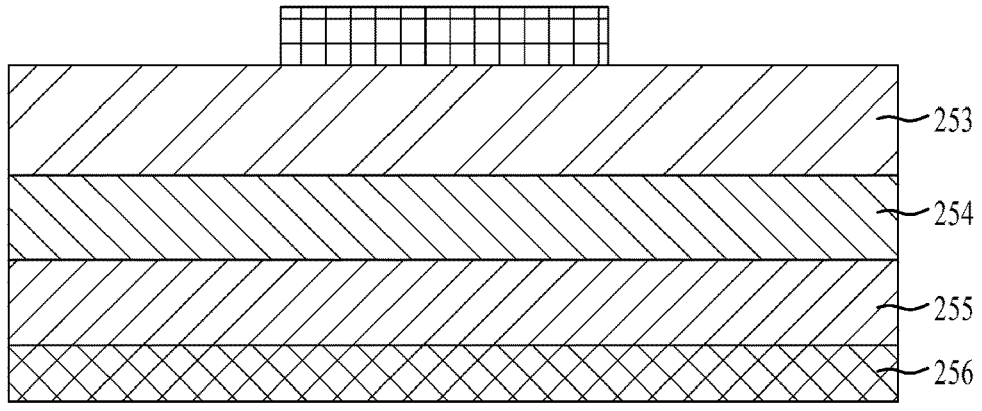
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
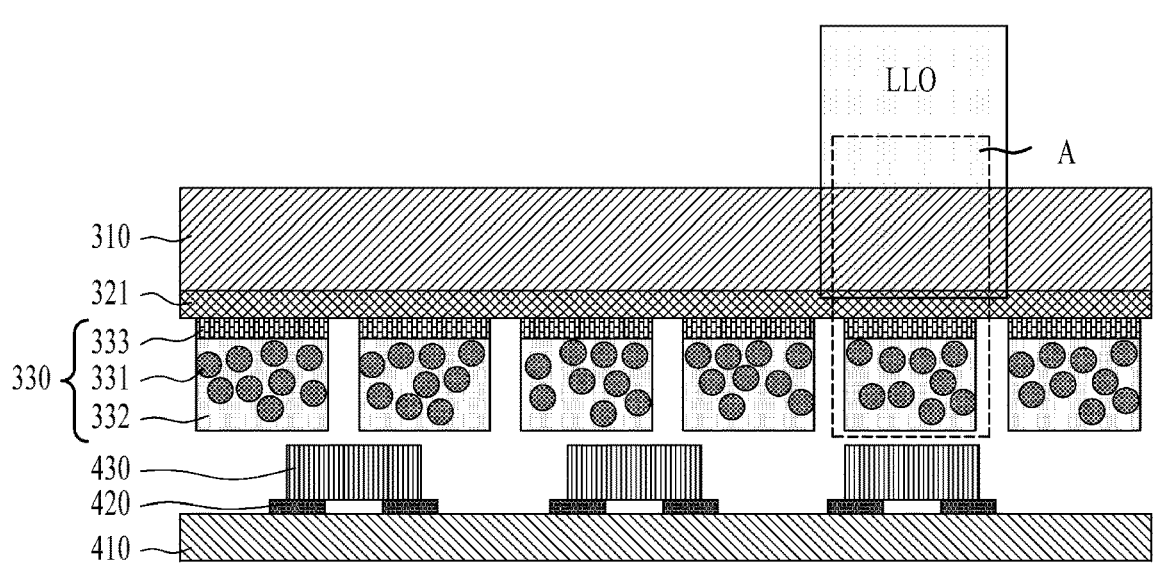
FIG. 10 is a diagram illustrating a case in which an organic material is used as a material of a conventional light absorbing layer.

FIG. 10 shows a stacked structure of a phosphor transfer substrate using an organic material as a separation layer.

Figure 11:
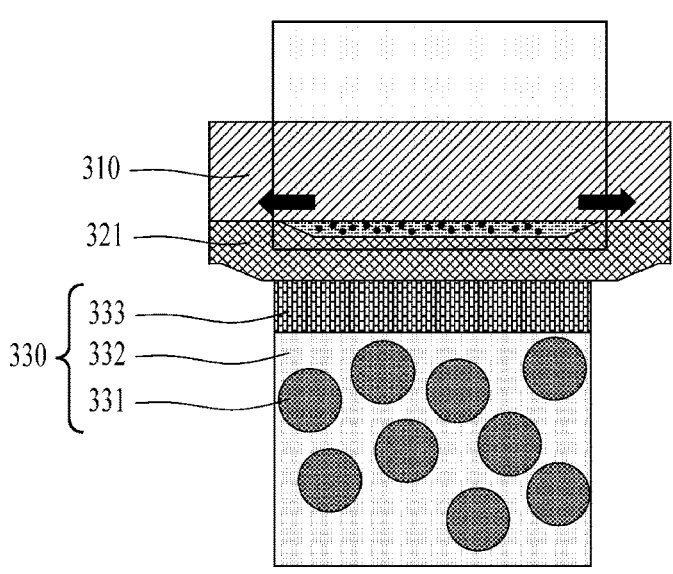
FIG. 11 is a diagram illustrating a process in which a phosphor structure is transferred when an organic material is used as a material for a conventional light absorbing layer.

FIG. 11 is an enlarged view of a portion A in FIG. 10.

In a process of transferring a transfer substrate 310 including a phosphor structure onto a wiring substrate 410, the transfer substrate 310 in a display device may include a temporary substrate 310, a light absorbing layer 321 formed as an organic layer, and a unit phosphor structure 330.

In addition, such transfer substrate 310 is transferred onto the wiring substrate 410 including a semiconductor light emitting element 430 and wiring 420, so that the phosphor structure 330 is disposed on the semiconductor light emitting element 430.

The wiring substrate 410 may be a substrate including a printed circuit that applies an electrical signal to the semiconductor light emitting element 430. Specifically, the wiring substrate 410 may include the substrate 110, the first electrode 120, the second electrode 140, and the insulating layer 160 described above.

The phosphor structure 330 may be disposed on the semiconductor light emitting element 430 to convert a color of light generated by the semiconductor light emitting element 430 into a different color. Specifically, the phosphor structure 330 may include a phosphor 331 and a phosphor binder 332 for fixing the phosphor 331.

The phosphor 331 may correspond to at least one of the red phosphor 181, the green phosphor 182, and the blue phosphor 183 described in FIG. 5. The phosphor 220 may be formed as at least one of an organic phosphor, a quantum dot, and an inorganic phosphor.

The phosphor binder 332 as a component for fixing the phosphor 331 may be made of a transparent material. As the phosphor binder 230, an organic binder or an inorganic color conversion material may be used. Specifically, an epoxy or silicone-based material may be mainly used as the organic binder. Phosphor ceramic (PC), phosphor glass ceramic (PGC), phosphor in glass (PiG), and bulk glass phosphor (BGP) may be used as the inorganic color conversion material.

The phosphor structure 330 may be partially coated on the semiconductor light emitting element 430 using an inkjet, or a pattern thereof may be formed via a photolithography process. Because of a thixotropic nature of the phosphor structure 230, a partition wall structure to prevent the phosphor structure 330 from spreading may be required. Hereinafter, a method for manufacturing the phosphor structure will be described in detail with reference to FIGS. 19 and 21.

As shown in FIG. 10, the formed phosphor structure 330 may be transferred onto the semiconductor light emitting element 430 via a transfer process such as LLO. In this regard, the light absorbing layer 321 may be further included between the phosphor structure 330 and the temporary substrate 310. In this regard, the light absorbing layer may be formed as the organic layer.

However, when the light absorbing layer is formed as the organic layer, a problem that the phosphor structure is not partially transferred may occur. Hereinafter, a process of separating the phosphor structure from the light absorbing layer composed of the organic material will be described with reference to FIG. 11.

The phosphor structure 330 may be heated by a laser during a LLO process. In this regard, thermal energy may be absorbed at an interface (hereinafter, referred to as a first interface) where the light absorbing layer 321 formed as the organic layer and the temporary substrate 310 are in contact with each other. Vaporization of the light absorbing layer 321 formed as the organic layer may occur locally at the first interface by the absorbed thermal energy, so that the transfer substrate and the light absorbing layer 321 may be separated from each other at the first interface.

That is, as both ends of the organic layer 321 are separated from each other by the vaporization, the phosphor structure 330 is transferred. However, when the vaporization occurs only in a portion of the first interface located above the phosphor structure 330, because of the organic layer 321 formed as an integral plane, the organic layer 321 may not be separated.

In this case, as the temporary substrate 310 and the organic layer 321 are separated from each other, the thermal energy is not conducted downwardly of the organic layer 321 but is conducted along the first interface (see arrows in FIG. 11). That is, because of the separation of the light absorbing layer, heat is not transferred to an interface (hereinafter, referred to as a second interface) where the light absorbing layer 321 and the phosphor structure 330 are in contact with each other. Accordingly, the vaporization of the organic layer 321 does not occur at the second interface and thus the phosphor structure 330 also maintains an adhered state.

That is, the phosphor structure 330 may be re-adhered to the temporary substrate 310 without being separated from the temporary substrate 310 even after the LLO process is finished. Therefore, there is a problem in that the phosphor structure 330 is not partially transferred from the transfer substrate.

To solve such problem, a transfer substrate including the phosphor structure 330 as a unit structure and a method for manufacturing a display device using the same will be described below.

Figure 12:
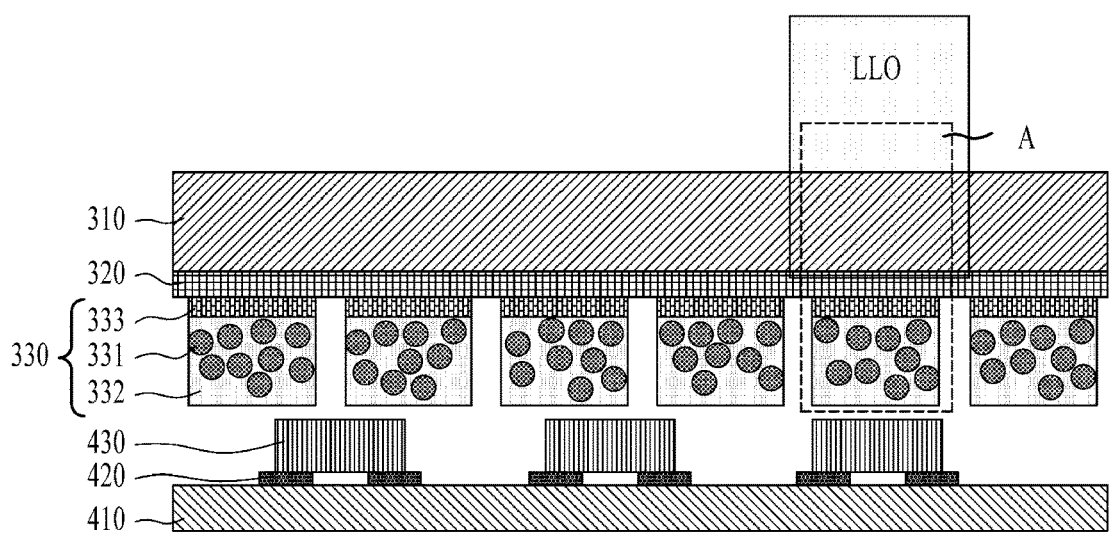
FIG. 12 is a diagram illustrating a transfer substrate with a phosphor structure according to an embodiment of the present disclosure.

FIG. 12 is a diagram illustrating a transfer substrate with a phosphor structure according to an embodiment of the present disclosure.

Figure 13:
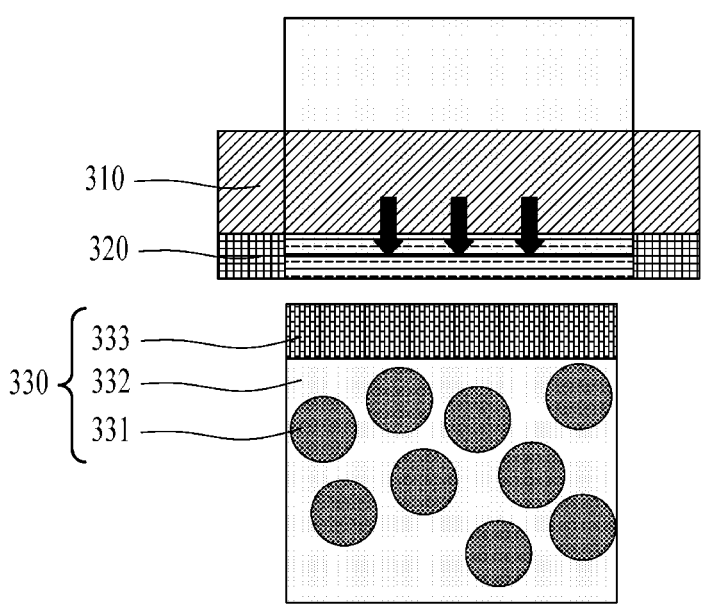
FIG. 13 is a diagram illustrating a transfer process in a case in which an inorganic layer is used as a material for a light absorbing layer as an embodiment of the present disclosure.

FIG. 13 is a diagram illustrating a transfer process in a case in which an inorganic layer is used as a material for a light absorbing layer as an embodiment of the present disclosure.

In the process of transferring the transfer substrate 310 including the phosphor structure onto the wiring substrate 410, the transfer substrate 310 according to one embodiment of the present disclosure may include the temporary substrate 310, a light absorbing layer 320 formed as an inorganic layer, and a unit phosphor structure 330.

In addition, such transfer substrate 310 is transferred onto the wiring substrate 410 including the semiconductor light emitting element 430 and the wiring 420, so that the phosphor structure 330 is disposed on the semiconductor light emitting element 430.

The transfer substrate 310 as a substrate on which the phosphor structure 330 is stacked may be a temporary substrate or a donor for transferring the phosphor structure 330.

The phosphor structure 330 may be composed of a unit structure and may include a plurality of phosphor structures. The phosphor structures 330 may be separated from each other and formed in an independent shape. Each unit phosphor structure 330 may be transferred one-to-one onto the semiconductor light emitting element 430.

Specifically, the plurality of unit phosphor structures 330 may be arranged along at least one row and at least one column on the temporary substrate 310. The unit phosphor structure 330 may be spaced apart from another adjacent unit phosphor structure 230 by a predetermined distance.

As shown in FIG. 12, the unit phosphor structure 330 may basically include the phosphor 331, the phosphor binder 332 for fixing the phosphor 331, and a color filter 333.

The color filter 333 may be a filter that passes light of a specific wavelength therethrough. The color filter 333 may prevent light generated by the semiconductor light emitting element 430 and light whose wavelength is converted via the phosphor 331 from being emitted by being mixed with each other. A wavelength of the light generated by the semiconductor light emitting element 430 may be blocked, and the wavelength of the light changed via the phosphor 331 may pass. For example, when the semiconductor light emitting element 430 generates blue light and the phosphor 331 changes the blue light into red light, the color filter 333 may block the blue light and pass the red light. The color filter 333 may generate the red light using the semiconductor light emitting element 430 that generates the blue light.

The color filter 333 may be segmented like the unit phosphor structures 330. However, in some cases, the color filter 333 may be integrally stacked on the temporary substrate 310 in a film structure. When the color filter 333 is integrally formed, the color filter 333 may be segmented based on the unit structure when the phosphor structures 330 are transferred onto the semiconductor light emitting elements 430.

The inorganic layer may be used as the light absorbing layer 320. The light absorbing layer 320 using such an inorganic layer may be separated from the temporary substrate 310 such that the unit phosphor structure 330 is transferred from the temporary substrate 310 by absorbing light generated by the LLO.

As shown in FIG. 13, the phosphor structure 330 may be separated from the temporary substrate 310 and transferred onto the semiconductor light emitting element 430 while the light absorbing layer 320 formed as the inorganic layer is heated by the laser and deformed during the LLO process.

Specifically, when the light absorbing layer 320 formed as the inorganic layer receives the thermal energy, a crystal structure of the inorganic layer 320 may change at the first interface by the absorbed thermal energy. However, unlike the case of using the light absorbing layer 321 formed as the organic layer, the inorganic layer 320, which has relatively good adhesion to the temporary substrate 310, may maintain the adhered state without being separated from the temporary substrate 310 even when the crystal structure thereof changes.

That is, because the temporary substrate 310 and the light absorbing layer 320 are adhered to each other, the thermal energy may be relatively easily conducted from the temporary substrate 310 toward the second interface. Accordingly, the change in the crystal structure of the inorganic layer 320 may occur because of the thermal energy at the second interface as well, and the phosphor structure 330 may be transferred while being separated from the temporary substrate 310 because of such change in the crystal structure.

In this regard, the light absorbing layer 320 formed as the inorganic layer may has an amorphous crystal structure that may be varied by absorbing light. Specifically, an amorphous material such as a-Si or an ITO may be used, and such crystal structure may be deformed by receiving heat generated by the light.

That is, the separation may occur at the interface between the light absorbing layer 320 formed as the inorganic layer and the phosphor structure 330 because of the conduction of the heat, so that re-adhering of the phosphor structure 330 may be prevented.

Therefore, when using the light absorbing layer 320 formed as the inorganic layer, the transfer may be performed more easily compared to when using the light absorbing layer 321 formed as the organic layer. In addition, in such process, the re-adhering of the phosphor structure 330 does not occur, so that the problem that the transfer is not performed on the portion of the temporary substrate 310 may be solved.

However, during the lift-off, a range to which the laser is applied may be larger than an area size of a surface of the one unit phosphor structure 330. In this case, during the LLO process, there is a problem that an electrode 420 or the like positioned on the wiring substrate 410 may be damaged by the laser.

Therefore, to solve such problem, the wiring substrate 410 may be protected using a following structure. This will be described below.

Figure 14:
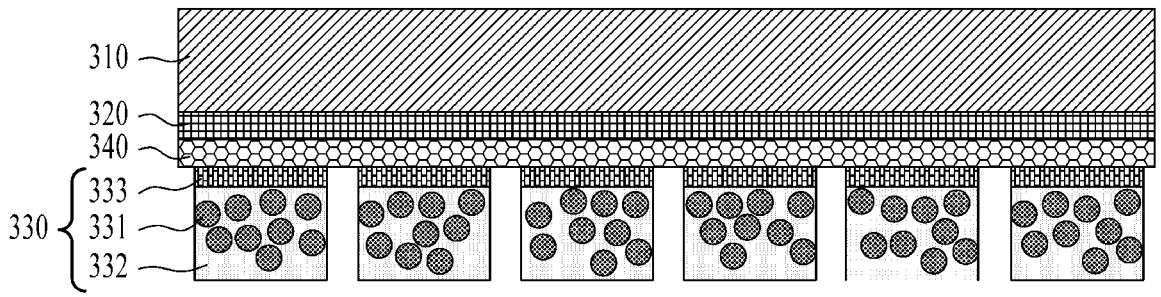
FIG. 14 is a diagram illustrating that a protective layer is further included in a transfer substrate with a phosphor structure according to one embodiment of the present disclosure.

FIG. 14 is a diagram illustrating that a protective layer is further included in a transfer substrate with a phosphor structure according to one embodiment of the present disclosure.

The transfer substrate with the phosphor structure according to one embodiment of the present disclosure includes the temporary substrate 310, the light absorbing layer 320 stacked on the temporary substrate, and the unit phosphor structure 330 stacked on the light absorbing layer 320, and further includes a protective layer 340 disposed between the light absorbing layer 320 and the unit phosphor structure 330.

A material having adhesiveness may be used for the phosphor structure 330 to be positioned on the semiconductor light emitting element 430 stacked on the wiring substrate 410 without a separate adhesive. In this regard, the phosphor structure 330 may maintain the adhesiveness without being cured by heat or ultraviolet light.

The light absorbing layer 320 and the protective layer 340 may contain a UV light-curable resin or a thermosetting resin such as a transparent acrylic or epoxy-based resin. A curable resin may undergo an irreversible chemical change when cured by the heat or the ultraviolet light. Specifically, the protective layer 340 containing the thermosetting resin may have non-viscoelastic properties while a polymer contained in the protective layer 340 forms a net-like structure by the curing.

That is, after the curing operation, the phosphor structure 330 may maintain viscoelastic properties, and the light absorbing layer 320 and the protective layer 340 may have the non-viscoelastic properties. Therefore, in the LLO process, the light absorbing layer 320 and the protective layer 340 having the non-viscoelastic properties may be separated from each other and the protective layer 340 and the phosphor structure 330 may remain adhered to each other. Specifically, the cured light absorbing layer 320 and protective layer 340 may be separated from each other because of different interface structures, and the protective layer 340 and the phosphor structure 330 may remain adhered to each other because of the viscoelastic properties of the phosphor structure 330. That is, because of a difference in a hardness of the components, divisional transfer of the phosphor structure 330 is possible.

In addition, the protective layer 340 may block the laser irradiated during the LLO process to prevent the phosphor structure 330 and the wiring substrate 410 from being damaged. Specifically, the protective layer 340 may absorb a wavelength band of the laser irradiated in the LLO process and be cured or reflect the wavelength band of the laser to lower a ratio of the laser transmitted through the protective layer 340. In this regard, the protective layer 340 may preferably have high transmittance with respect to a wavelength in a visible light band.

Figure 15:
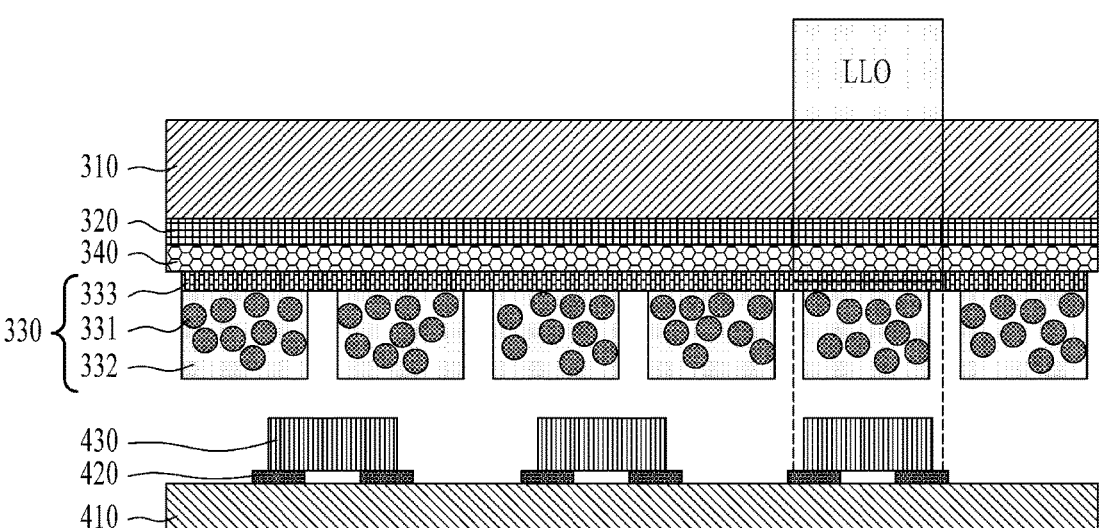
FIG. 15 is a diagram illustrating that color filters are connected to each other according to one embodiment of the present disclosure.

FIG. 15 is a diagram illustrating that the color filter 333 is not segmented based on the unit phosphor structure 330 but is integrally formed.

As shown in FIG. 15, one phosphor structure 330 may be connected to another neighboring phosphor structure 330 via the color filter 333.

When the color filter 333 is integrally formed, the wiring substrate 410 located below the unit phosphor structure 330 may be more protected from the laser than when only the protective layer 340 is disposed.

That is, when the color filter 333 is located between the phosphor structures 330 and has a structure of covering side surfaces of the phosphor structures 330 when being separated by the laser, the color filter 333 may play a role of preventing damage to a lower structure of the wiring substrate 410 by the laser.

Specifically, conductive balls, the wiring, the electrodes, and the like located on the wiring substrate 410 may be protected.

Figure 16:
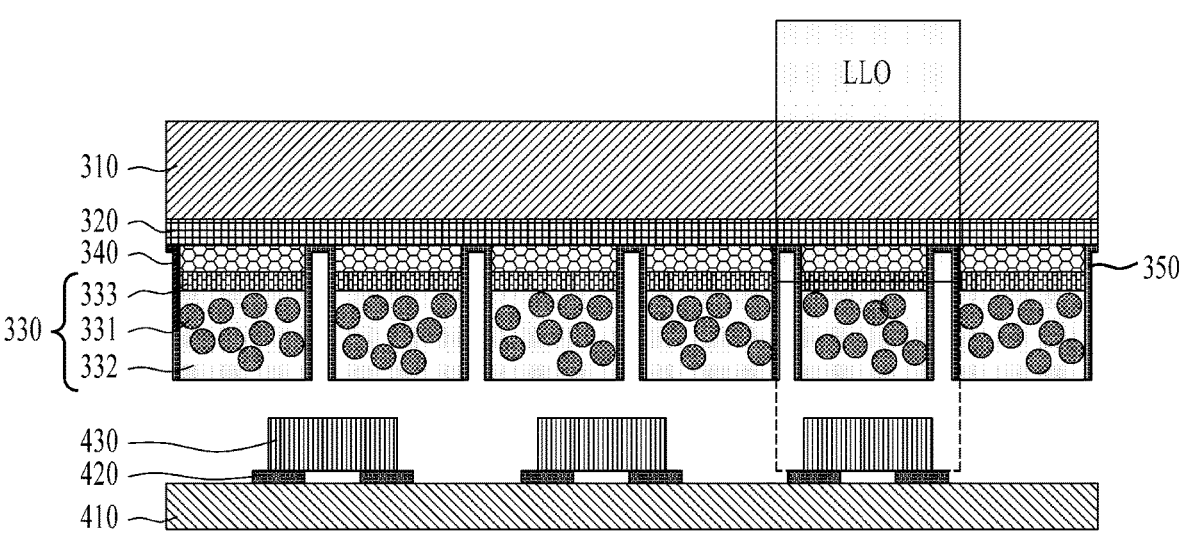
FIG. 16 is a diagram illustrating a transfer substrate further including a metal film according to one embodiment of the present disclosure.

FIG. 16 is a diagram illustrating a transfer substrate further including a metal film according to one embodiment of the present disclosure.

As shown in FIG. 16, the transfer substrate may include the temporary substrate 310, the light absorbing layer 320 disposed on the temporary substrate 310, the protective layer 340 disposed on the light absorbing layer, the phosphor structure 330 stacked on the protective layer, and a metal film 350 positioned between the phosphor structures.

The protective layer 340 and the color filter 333 may be segmented on the light absorbing layer 320 to correspond to areas where the plurality of phosphor structures 330 are arranged. In this regard, because both the protective layer 340 and the color filter 333 are segmented based on a size of the phosphor structure 330, damage to the structure on the wiring substrate 410 by the laser is not able to be prevented during the LLO process.

Accordingly, to solve such problem and prevent the damage to the wiring substrate 410, the metal film 350 may be further included.

Each metal film 350 may be disposed between adjacent two unit phosphor structures 330 to correspond to an area where the protective layer 340 is segmented.

In addition, each metal film 350 may be applied to the side surfaces of the adjacent two unit phosphor structures 330.

As the metal film 350 is disposed between the unit phosphor structures 330 along the segmented protective layer 340, the damage to the wiring substrate 410 may be prevented by preventing the laser from being directed toward the wiring substrate 410 during the LLO process. Specifically, as a transmittance of the metal film 350 having a film shape becomes 0, the wiring substrate 410 may be protected from the laser.

However, because the color filter 333 contains pigment, the color filter 333 has relatively weak adhesion. In this regard, to solve the problem of weak adhesion of the color filter 333 containing different materials, adhesiveness of the phosphor structure 330 and the color filter 333 may be improved using a following structure.

Figure 17:
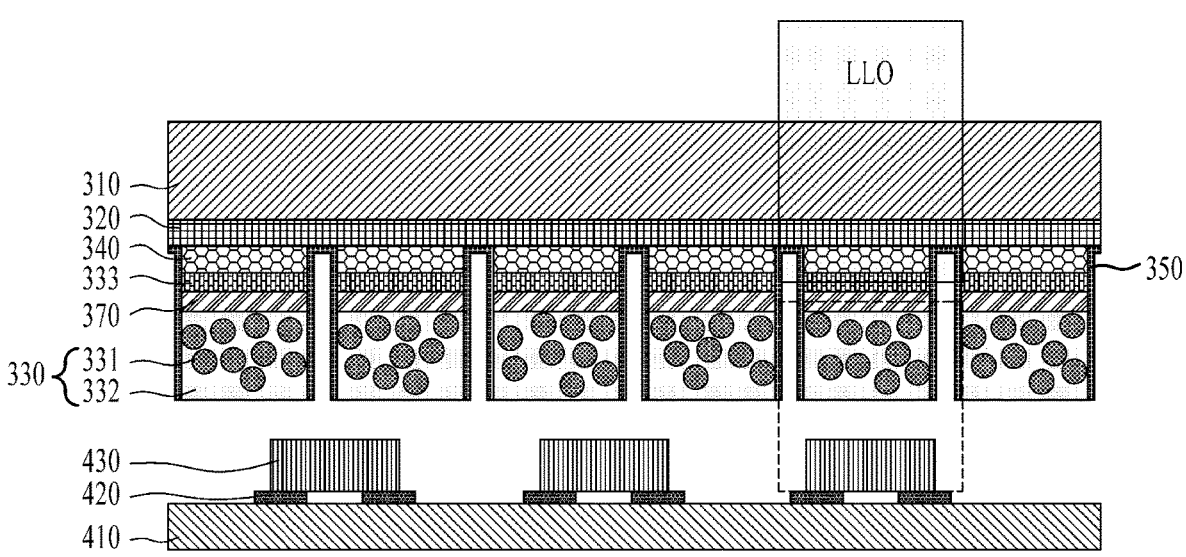
FIG. 17 is a diagram illustrating a transfer substrate further including an adhesive layer according to one embodiment of the present disclosure.

FIG. 17 is a diagram illustrating a transfer substrate further including an adhesive layer according to one embodiment of the present disclosure.

Figure 18:
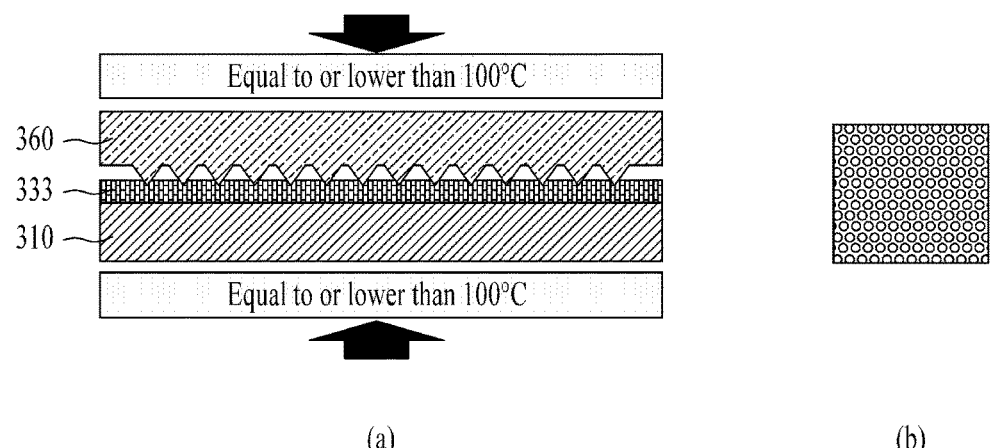
FIG. 18 is a diagram illustrating a transfer substrate on which a micro lens structure is printed at an interface with a phosphor structure.

FIG. 18 is a diagram illustrating a transfer substrate on which a micro lens structure is printed at an interface with the phosphor structure 330.

As shown in FIG. 17, the transfer substrate may include the temporary substrate 310, the light absorbing layer 320 disposed on the temporary substrate 310, the protective layer 340 disposed on the light absorbing layer, the phosphor structure 330 stacked on the protective layer, the metal film 350 positioned between the phosphor structures, and an adhesive layer 370 disposed between the phosphor binder 332 and the color filter 333.

When the protective layer 340 and the adhesive layer 370 are positioned with the color filter 333 interposed therebetween, the color filter 333 may be protected from damage.

The protective layer 340 may be made of the same type of resin as the color filter 333.

The adhesive layer 370 may be made of the same type of resin as the color filter 333.

That is, the same material as that of the color filter 333 is used for the protective layer 340 and the adhesive layer 370 and the material does not contain the pigment, so that adhesion with the color filter 333 may be strengthened and the color filter 333 may be further protected.

In this regard, as shown in FIG. 18, a structure 360 such as a micro lens may be inserted into the interface with the phosphor binder 332 to further improve the adhesion with the phosphor structure 330.

The micro lens structure 360 may have a structure of a lens in a microunit. In this regard, a shape of the lens may be circular or polygonal. Further, the lens in the microunit may not only be a spherical surface of a convex lens, but also be a lens of a composite structure in which another concave lens is formed on the spherical surface of the convex lens.

The micro lens structure 360 may imprint the micro lens structure in the adhesive layer 370 via lamination or an imprinting technology using a film of a lens structure. However, a manufacturing method of the micro lens structure may not be limited, and the micro lens structure may be manufactured in any method such as photolithography or inkjet printing.

Specifically, after applying the adhesive layer 370, the lens structure may be imprinted at a low temperature before the adhesive layer 370 is cured. When a negative PR is used, a micropattern may be formed even at a low temperature equal to or lower than 100 degrees after the photolithography.

As shown in (a) in FIG. 18, the micro lens-shaped structure may be easily imprinted when using an existing product such as a patterned sapphire substrate (PSS). In this regard, as shown in (b) in FIG. 18, a shape in which the micro lens-shaped structure is imprinted in the color filter may be obtained.

Hereinafter, a method for manufacturing the transfer substrate with the phosphor structure 330 will be described.

Figure 19:
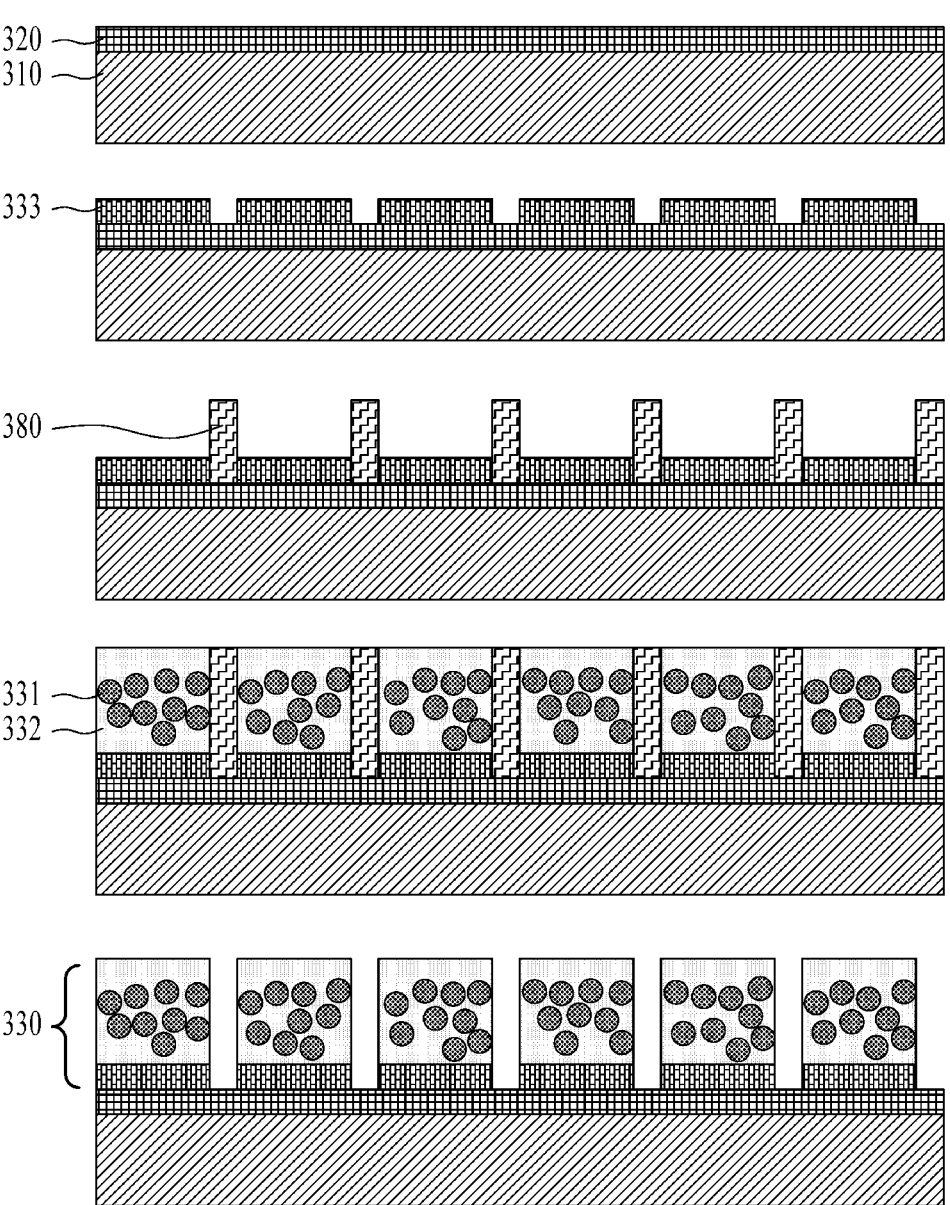
FIG. 19 is a diagram illustrating a method for manufacturing a transfer substrate according to an embodiment of the present disclosure.

FIG. 19 is a diagram illustrating a method for manufacturing a transfer substrate according to an embodiment of the present disclosure.

The method for manufacturing the transfer substrate with the phosphor structure 330 may include stacking the light absorbing layer 320, which is the inorganic layer, on the temporary substrate 310. In this regard, the light absorbing layer 320 may have the amorphous crystal structure that is varied by absorbing the light. Because of such light absorbing layer 320, the unit phosphor structure 320 may be separated from the temporary substrate 310 by absorbing the light during the LLO process.

Stacking the protective layer between the light absorbing layer 320 and the color filter 333 may be included. In the stacking of the protective layer, the protective layer may be stacked in a segmented state corresponding to a pattern of the color filter 333 to be described later.

Patterning the color filter 333 on the light absorbing layer may be included. Specifically, the color filter 333 may coat a surface where the color filter 333 is in contact with the light absorbing layer 320 and segmented during a development process.

Placing each partition wall 380 between two segmented color filters 333 may be included. However, the partition walls 380 may be placed first and then each color filter 333 may be coated between two adjacent partition walls 380. In this case, the color filter 333 may coat a side surface of the partition wall 380 together with the surface where the color filter 333 is in contact with the light absorbing layer 320. Specifically, each color filter 333 may be coated in a concave shape between the two adjacent partition walls 380.

Each phosphor structure 330 may be stacked by filling the phosphor 331 and the phosphor binder 332 so as to be disposed between two adjacent partition walls 380 and positioned on each segmented color filter 333. In this regard, the phosphor 331 may be in a solid state and the phosphor binder 332 may be in a liquid state. The phosphor 331 and the phosphor binder 332 may be filled between the two adjacent partition walls 380 using a squeegee method.

After the phosphor structures 330 are formed, removing the partition walls 380 may be included. Therefore, the unit phosphor structures 330 may be formed on the temporary substrate 310 to be spaced apart from each other.

Applying each metal film between the two adjacent phosphor structures 330 corresponding to each area where the protective layer is segmented may be further included.

In the case of the transfer substrate including the above-described phosphor structure 330, direct transfer to the wiring substrate 410 is possible, which is more economical than a display manufacturing method including two or more transfers.

In this regard, in the process of curing the phosphor binder 332 having the viscoelastic properties, a force for fixing the phosphor 331 may decrease. Accordingly, in the phosphor structure 330 transferred onto the semiconductor light emitting element 430, the phosphor 331 may be positioned at a relatively upper portion. When the phosphor 331 is located at the relatively upper portion, there is a possibility of light leakage, so that a structure to solve such problem will be described below.

Figure 20:
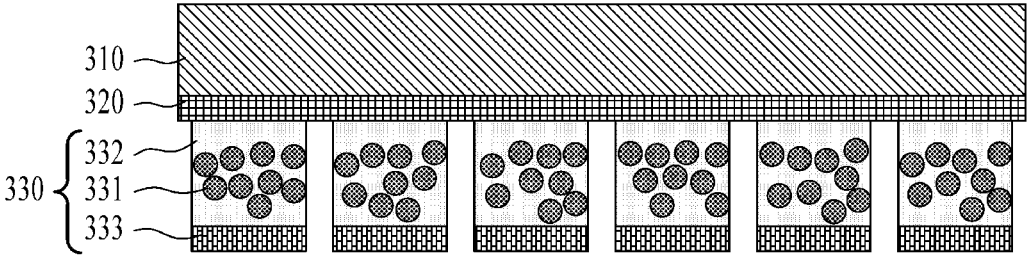
FIG. 20 is a diagram illustrating a transfer substrate where transfer via a temporary substrate is performed according to one embodiment of the present disclosure.

FIG. 20 is a diagram illustrating a transfer substrate where transfer via a temporary substrate is performed according to one embodiment of the present disclosure. For a detailed description of a duplicated structure, refer to the above description.

The transfer substrate including the phosphor structure 330 may include the temporary substrate 310, the light absorbing layer 320 disposed on the temporary substrate, the phosphor structure 330 disposed on the light absorbing layer 320, and the color filter 333 disposed on a side opposite to the light absorbing layer 320 and positioned on the phosphor structure 330.

That is, when the temporary substrate 310 including the phosphor structure 330 is transferred onto an intermediate base 510 (see FIG. 22), the color filter 333 may be positioned between the intermediate base 510 and the phosphor structure 330.

With such a structure, unlike the case of direct transfer, the phosphor is subjected to two transfer processes and is located at a relatively lower portion during final transfer. The light leakage may be relatively reduced when the phosphor is positioned at the relatively lower portion of the phosphor structure.

Figure 21:
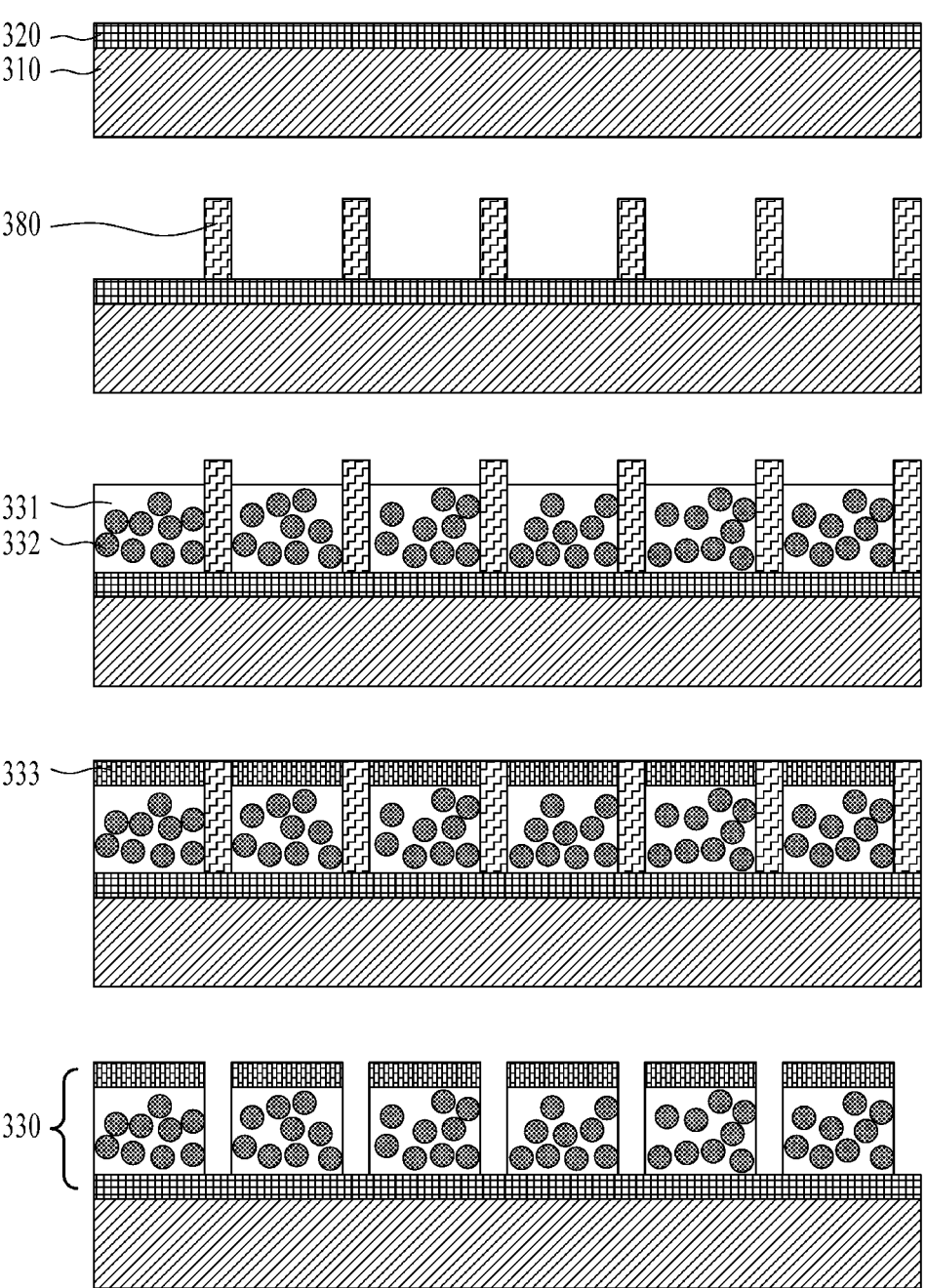
FIG. 21 is a diagram illustrating a method for manufacturing a transfer substrate where transfer via a temporary substrate is performed according to one embodiment of the present disclosure.

FIG. 21 is a diagram illustrating a method for manufacturing a transfer substrate where transfer via a temporary substrate is performed according to one embodiment of the present disclosure. For a detailed description of a duplicated structure, refer to the above description.

The method for manufacturing the transfer substrate with the phosphor structure 330 may include stacking the light absorbing layer 320, which is the inorganic layer, on the temporary substrate 310.

Placing the partition wall 380 on such light absorbing layer 320 may be included. The partition wall 380 may be formed in a grid pattern on the temporary substrate 310. Forming the partition wall 380 may include forming a sacrificial layer on the temporary substrate 310, placing a photo mask on the sacrificial layer corresponding to a position of the partition wall 380, partially curing the sacrificial layer, and developing an uncured portion of the sacrificial layer except for the partition wall 380.

Stacking the phosphor binder 332 containing the phosphor 331 between the partition walls 380 may be included. Therefore, the phosphor structure 330 including the phosphor 331 and the phosphor binder 332 may be formed.

Stacking the color filter 333 on the phosphor structure 330 and removing the partition wall 380 may be included. The partition wall 380 may be removed using an etching solution.

Accordingly, the transfer substrate including the phosphor structure 330 in which the light absorbing layer 320 and the color filter 333 are located on opposite sides of each other with the phosphor binder 33 interposed therebetween may be manufactured.

Figure 22:
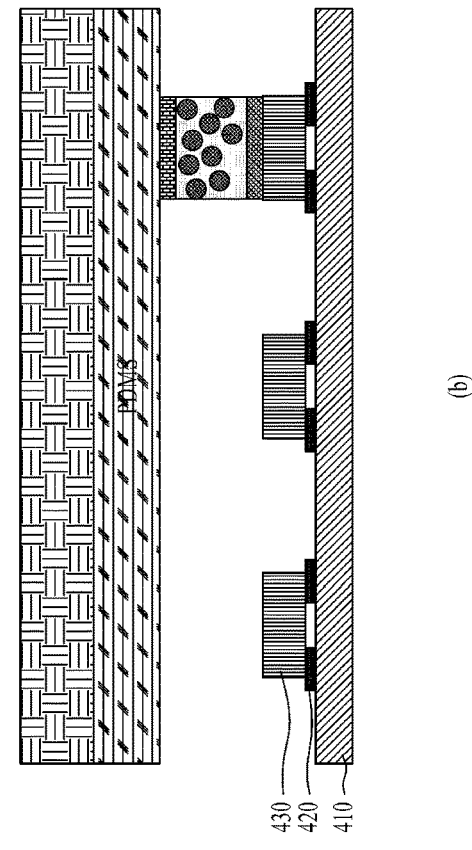
FIG. 22 is a diagram illustrating a process of transferring a transfer substrate where transfer via a temporary substrate is performed onto an intermediate base and a wiring substrate according to one embodiment of the present disclosure.
Figure 22:
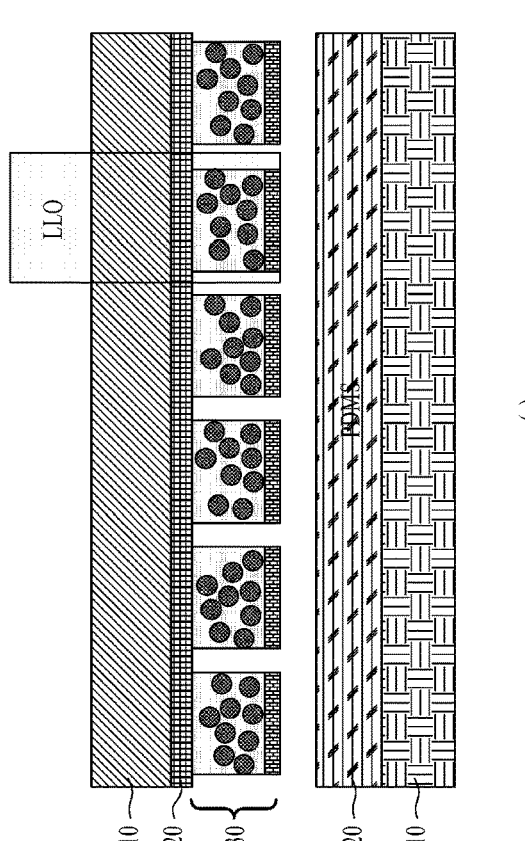

FIG. 22 is a diagram illustrating a process of transferring a transfer substrate where transfer via a temporary substrate is performed onto an intermediate base and a wiring substrate according to one embodiment of the present disclosure.

The transfer substrate includes the temporary substrate 310, the light absorbing layer 320 disposed on the temporary substrate 310, the phosphor structure 330 disposed on the light absorbing layer, and the color filter 333 positioned on the side opposite to the light absorbing layer 320.

An intermediate substrate includes the intermediate base 510 and an elastic layer 520 positioned on the intermediate base.

For example, PDMS, which is a polymer material, may be used for the elastic layer 520, but any material having the viscoelastic properties may be used.

A wiring substrate includes the wiring substrate 410, a wiring electrode 420 positioned on the wiring substrate, and the semiconductor light emitting element 430 electrically connected to the wiring electrode 420 and disposed on the wiring substrate 410.

In this regard, an adhesive layer 440 may be further disposed on the semiconductor light emitting element 430. Because of such adhesive layer 440, adhesion between the semiconductor light emitting element 430 and the phosphor structure 330 may be improved. As described above, the same material as that of the color filter 333 excluding the pigment may be used for the adhesive layer 440.

The transfer substrate including the phosphor structure 330 may be transferred onto the intermediate substrate via the LLO process. In this regard, the phosphor structure 330 may be easily transferred onto the intermediate substrate by the elastic layer 520.

Specifically, in the process in which the phosphor structure 330 is separated from the temporary substrate 310 and transferred onto the elastic layer 520, the phosphor structure 330 may apply a pressure to the elastic layer 520. In this regard, the elastic layer 520 that has received the pressure may deform in shape based on the pressure transmitted via the phosphor structure 330 because of the viscoelasticity. Therefore, when the phosphor structure 330 is transferred, adhesion between the phosphor structure 330 and the elastic layer 520 may be increased.

In the case of direct transfer from the transfer substrate to the wiring substrate, even when the phosphor structure applies a pressure to the wiring substrate, the wiring substrate without the elasticity does not deform based on a shape of the phosphor structure. That is, the adhesion between the phosphor structure and the wiring substrate may be weak, and thus a transfer efficiency may be low.

However, in the case of transfer to the wiring substrate via the intermediate substrate, the adhesion is excellent and thus the transfer efficiency is high.

The intermediate substrate onto which the phosphor structure 330 is transferred may be transferred onto the wiring substrate 410 including the semiconductor light emitting element 430. Specifically, the phosphor structure 330 positioned on the elastic layer 520 may be positioned on the semiconductor light emitting element 430 and transferred using a stamp method.

At this time, the semiconductor light emitting element 430 and the phosphor structure 330 may be adhered to each other and fixed by the adhesive layer 440.

The transfer substrate including the phosphor structure according to one embodiment may include the light absorbing layer formed as the inorganic layer between the phosphor structure and the temporary substrate, so that the situation in which the transfer is not performed or the phosphor structure is re-adhered to the temporary substrate again after being transferred may be prevented.

The transfer substrate including the phosphor structure according to one embodiment may further include the protective layer between the light absorbing layer and the phosphor structure to prevent the damage to the color filter and the wiring substrate.

The transfer substrate including the phosphor structure according to one embodiment may further include each metal film between the adjacent two phosphor structures to prevent the damage to the color filter and the wiring substrate.

The transfer substrate including the phosphor structure according to one embodiment may further include the adhesive layer between the phosphor structure and the color filter to supplement the color filter having poor adhesion because of the pigment contained.

The transfer substrate including the phosphor structure according to one embodiment may form the lens structure between the phosphor binder and the color filter or between the phosphor binder and the adhesive layer to further improve the adhesion.

The transfer substrate including the phosphor structure according to one embodiment may place the color filter on the phosphor structure, thereby reducing the light leakage of the phosphor when the phosphor structure is transferred two times to the intermediate substrate and then to the wiring substrate.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments. The scope of protection of the present disclosure should be interpreted by the claims below, and all technical ideas within the scope equivalent thereto should be construed as being included in the scope of the present disclosure.

What is claimed is:

1. A transfer substrate for transferring a phosphor onto a semiconductor light emitting element, the transfer substrate comprising:
   a temporary substrate;
   a plurality of unit phosphor structures disposed on the temporary substrate and including a color filter, a phosphor stacked on the color filter, and a phosphor binder for fixing the phosphor; and
   a light absorbing layer including an inorganic material that has an amorphous material that has a variable structure by absorbing light, disposed between the temporary substrate and the color filter, for absorbing light to separate the phosphor structure from the temporary substrate.

2. The transfer substrate of claim 1, further comprising a protective layer for preventing the color filter from being damaged by light applied to the light absorbing layer and for adhering the light absorbing layer and the color filter.

3. The transfer substrate of claim 2, wherein the protective layer is disposed on the light absorbing layer and is divided into a plurality of portions to correspond to an area where the phosphor structure is disposed.

4. The transfer substrate of claim 3, further comprising a metal film between adjacent unit phosphor structures to correspond to an area where the protective layer is divided.

5. The transfer substrate of claim 4, wherein the metal film is on side surfaces of the adjacent unit phosphor structures.

6. The transfer substrate of claim 1, further comprising a micro lens pattern.

7. The transfer substrate of claim 6, wherein the micro lens pattern is included at an interface between the color filter and the phosphor binder.

8. A transfer substrate for transferring a phosphor onto a semiconductor light emitting element, the transfer substrate comprising:
   a temporary substrate;
   a plurality of unit phosphor structures disposed on the temporary substrate and including a phosphor, a phosphor binder for fixing the phosphor, and a color filter stacked on the phosphor binder; and
   a light absorbing layer including an inorganic layer disposed between the temporary substrate and the phosphor binder, for absorbing light to separate the unit phosphor structure from the temporary substrate.

* * * * *